US012283866B2

United States Patent
Rockstein et al.

(10) Patent No.: US 12,283,866 B2
(45) Date of Patent: Apr. 22, 2025

(54) ELECTRONIC CONTROL UNIT AND ELECTRIC POWER STEERING SYSTEM

(71) Applicant: Hella GmbH & Co. KGaA, Lippstadt (DE)

(72) Inventors: Martin Rockstein, Hamm (DE); Thomas Drewes, Paderborn (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 247 days.

(21) Appl. No.: 18/053,497

(22) Filed: Nov. 8, 2022

(65) Prior Publication Data

US 2023/0069267 A1 Mar. 2, 2023

Related U.S. Application Data

(63) Continuation of application No. PCT/EP2020/062850, filed on May 8, 2020.

(51) Int. Cl.
  *H02K 5/22* (2006.01)
  *B62D 5/04* (2006.01)
  *H02K 9/22* (2006.01)
  *H02K 11/33* (2016.01)
  *H05K 5/00* (2006.01)
  *H05K 7/20* (2006.01)

(52) U.S. Cl.
  CPC ........... *H02K 5/225* (2013.01); *B62D 5/0406* (2013.01); *H02K 9/227* (2021.01); *H02K 11/33* (2016.01); *H05K 5/0026* (2013.01); *H05K 7/2039* (2013.01); *H02K 2211/03* (2013.01)

(58) Field of Classification Search
  CPC ........ H02K 5/225; H02K 11/33; H02K 9/227; H02K 2211/03; B62D 5/0406; H05K 5/0026; H05K 7/2039
  See application file for complete search history.

(56) References Cited

U.S. PATENT DOCUMENTS

2019/0140520 A1\* 5/2019 Sato ...................... H02K 11/33

FOREIGN PATENT DOCUMENTS

| DE | 102016212862 A1 | 1/2018 |
| EP | 2757665 A1 | 7/2014 |
| EP | 3484027 A1 | 5/2019 |

\* cited by examiner

*Primary Examiner* — Jacob M Amick
(74) *Attorney, Agent, or Firm* — Husch Blackwell LLP

(57) ABSTRACT

An electronic control unit is provided for an electric power steering system. The electric power steering system includes a housing and an electric motor. The electronic control unit is arranged inside the housing and is electrically connected to the electric motor. The electronic control unit includes a first power board having a first electric motor connector for electric connection with the electric motor, and a second power board having a second electric motor connector for electric connection with the electric motor. A connector plate of the electronic control unit is electrically connected by at least one plug connector to the first power board via at least one first power connector, and to the second power board via at least one second power connector. The at least one first power connector is shorter than the at least one second power connector. An electric power steering system is also provided.

17 Claims, 11 Drawing Sheets

ELECTRONIC CONTROL UNIT AND ELECTRIC POWER STEERING SYSTEM

CROSS REFERENCE

This application claims priority to and is a continuation of PCT Application No. PCT/EP2020/062850, filed May 8, 2020, the entirety of which is hereby incorporated by reference.

FIELD OF THE INVENTION

The invention is directed at an electronic control unit for an electric power steering system and an electric power steering system.

BACKGROUND OF THE INVENTION

In the electric power steering system, the electronic control unit can be connected with an electric motor for supplying power to the electric motor from a power source such as a battery. The electric power steering system can assist in a handling operation, typically a steering, of a transportation equipment by a driver. The transportation equipment can be an automobile.

The electric power steering system may further comprise a torque sensor, a steering shaft, a handle, typically a steering wheel, and the power source. In the following, a typical arrangement and operation of the electric power steering apparatus in an automobile will be described.

The torque sensor may be mounted on the steering shaft. Upon rotating the steering shaft by operating the handle, the torque sensor detects a torque being applied to the steering shaft by the operation of the handle. Upon detection of the torque by means of the torque sensor, a torque signal is output from the torque sensor to the electronic control unit. The electronic control unit then drives the electric motor based at least on the torque signal. Optionally, the control device may include further data such as vehicle speed in addition to the torque signal for controlling the driving of the electric motor.

The electronic control unit drives the electric motor by supplying a driving current from the power source, such as the battery of the automobile, to the electric motor. A driving force generated from the electric motor is then transmitted to the wheels directly or via a gearbox depending on the configuration in the automobile. As a result, the electric power steering apparatus changes a steering angle of the wheels by amplifying the torque of the steering shaft by means of the electric motor. This enables the driver to operate the handle with less force.

The electronic control unit comprises a power board electrically connected with the electric motor. The power to the electric motor is transmitted via this power board. Thereby, the power board generates heat during operation of the electronic control unit. To prevent overheating and damage of the electronic control unit, a heat sink may be provided inside of the electronic control unit and arranged in thermal contact with a housing of the electric power steering system or electric motor.

DE 10 2016 212 862 A1 describes a power unit for an electric steering system. The power unit comprises a motor housing for a motor, a heat sink and control electronics for the motor attached to the heat sink.

BRIEF SUMMARY OF THE INVENTION

It is an object of the present invention to improve the electronic control unit for an electric power steering system and an electric power steering system known from the state of the art, in particular to provide an electronic control unit for an electric power steering system and an electric power steering system having improved assembly characteristics, in particular a compact, low-cost and easy-to-assemble design.

This problem is solved by an electronic control unit as disclosed herein. The features and details described in connection with the electronic control unit of the invention apply in connection with the electric power steering system and the other way around, so that regarding the disclosure of the individual aspects of the invention it is or can be referred to one another.

According to a first aspect of the invention, the problem is solved by an electronic control unit for an electric power steering system, the electric power steering system comprising a housing and an electric motor, the electronic control unit being configured to be arranged inside the housing and to be electrically connected to the electric motor, whereby the electronic control unit comprises a first power board having a first electric motor connector for electric connection with the electric motor, a second power board having a second electric motor connector for electric connection with the electric motor, and whereby a connector plate of the electronic control unit is electrically connected by means of at least one plug connector of the connector plate to the first power board via at least one first power connector and to the second power board via at least one second power connector, wherein the at least one first power connector is shorter than the at least one second power connector.

By means of providing different lengths of the first power connector and the second power connector, improved assembly characteristics, in particular a compact, low-cost and easy-to-assemble design, of the electronic control unit are achieved. That is, the first power board and the second power board may be arranged at different distances from the connector plate. Further, the first power board and the second power board may be arranged parallel to one another.

In particular, the first power connector may have a first length corresponding to a distance of the first power board from the connector plate and the second power connector may have a second length corresponding to a distance of the second power board from the connector plate, whereby the first length is smaller than the second length.

The first power board and the second power board may in particular be provided as printed circuit boards. The two power boards may comprise electronic components such as coils and capacitors for enabling the power board to transmit power from a power source to the electric motor.

The electric motor may in particular be arranged inside the housing. The housing may in particular be an electric motor housing, i.e. the housing of the electric motor. The housing may in particular have a tubular shape. The housing may further in particular have a circular or elliptical cross section. Also, the housing may be made from a heat-conducting material. The heat-conducting material may in particular be or comprise a metal such as aluminum, magnesium, copper or similar.

In particular, the two power boards may be separately from one another connected to the connector plate and thereby to the power source. The connector plate may be made from plastic, for example. The connector plate may be formed as a cap for sealing the housing at an end thereof. The connector plate may be provided with a sealing for sealing the inside of the housing against the outside. The sealing may be made from a silicone rubber. The connector plate may comprise one, two, three or more connectors, in particular plug connectors. At or inside of the plug connectors, the connector plate may be provided with electrical contacts. The electrical contacts may be made from a copper alloy, for example, to provide great electrical conductivity. One or multiple of the plug connectors may be provided for contacting the control board of the transportation equipment with the logic board. Thereby, the torque sensor, other sensors and/or other electronic control units may be connected to the logic board. The plug connectors may be connected by means of power connectors to the power boards.

It is possible, that the connector plate is connected to the first power board via two first power connectors and to the second power board via two second power connectors, wherein both first power connectors are shorter than both second power connectors.

Further, it is possible, that the at least one first power connector and/or the at least one second power connector are provided as metal strips. In particular, the metal strips may be provided as metal sheets. Aluminum, copper, alloys of the afore-mentioned or other metal having high electrical conductivity may be used for the metal strips. The at least one first power connector and the at least one second power connector may have flat and/or rectangular shape. The metal strips may be bent along their length such that they are positioned in the electronic control unit according to the defined geometry of other parts of the electronic control unit such as the power boards and the logic board.

It is further possible, that the at least one second power connector has at least 120%, in particular at least 150% and further in particular at least 200%, of the length of the first power connector. Thereby, a large heat sink, i.e. having a large thickness, may be arranged in between the two power boards for providing good heat dissipation characteristics.

It is possible, that each of the first power board and the second power board is provided with three phases of electricity to supply three-phase electric power to the electric motor. Thereby, both power boards are able to provide the electric motor with three-phase electric power independent from one another. Further, it is possible, that the first power board and the second power board are arranged to supply three-phase electric power to the electric motor upon failure of the other one of the first power board and the second power board. For this purpose, a logic board of the electronic control may be arranged to detect failure of one of the two power boards and instruct the functioning power board to drive the electric motor. Further, it is possible, that the first power board and the second power board are arranged as redundant power boards to supply six phases of electricity to the electric motor. For this purpose, the electric motor may be a six-phase electric motor. Thereby, a better and more reliable power transmission to the electric motor may be achieved. In particular, if one power board of the two power boards fails, the other one may still be operated to provide the electric motor with electricity. Thus, the electric motor can be separately driven by the driving current supplied separately by any one or both of the two power boards. Thereby, it can be ensured that the electronic control unit can safely provide the electric motor with electricity even when one of the two power boards fail. This provides for a redundant and failure unsusceptible design of the electronic control unit and the electric power steering system.

Further, it is possible, that the logic board is sandwiched in between the first power board and the connector plate. The logic board may in particular be provided as a printed circuit board. The logic board does not have to be attached to a heat sink of the electronic control unit. In particular, the logic board may not be attached to the heat sink. The logic board in operation of the electronic control unit generates less heat than the two power boards and thus it may be prioritized that the two power boards that are generating more heat in operation of the electronic control unit are attached to the heat sink.

Thereby, it is possible that the logic board is logically connected to at least one of the at least one plug connector of the connector plate by means of at least one signal connector. Thereby, the connector plate is logically connected to the logic board separate from its power connection with the power boards.

It is also possible, that the first power board comprises at least one first power board recess through which the at least one second power connector extends to the second power board. Thereby, the first power connector may be easily guided through the first power board and to the second power board.

It is also possible, that the electronic control unit comprises a heat sink, the heat sink being sandwiched in between the first power board and the second power board. The first power board may be provided on one side of the heat sink and the second power board may be provided on another side of the heat sink. The first power board and the second power board may be directly attached with their circuit board and electronic components to the heat sink. A thermal interface material may be provided between the first power board and the heat sink and the second power board and the heat sink to thermally attached the respective parts with each other for better thermal conductivity.

Both power boards may be attached to the heat sink. In particular, both power boards may be fitted onto the heat sink. Both power boards may be surround by a heat sink edge of the heat sink. The heat sink edge of the heat sink may comprise a groove arranged for crimping the housing into the groove and thereby at least securing, and possibly thermally connecting, the heat sink with the housing. When crimping the housing into the groove of the heat sink, a particularly tight fitting of the heat sink inside of the housing is achieved and the thermal conductivity from the heat sink to the housing is improved. Further, the overall contact surface of the heat sink with the housing and thereby the overall thermal conductivity from the heat sink to the housing is even further improved. Also, providing the heat sink with the groove may be performed at relatively low cost when manufacturing the heat sink and the crimping of the housing into the groove is a relatively simple, fast and cost-effective way of securing the heat sink and in particular in the entire electronic control unit with the housing of the electric power steering system. The crimping may be performed by squeezing the housing at its outer side into the groove. Thereby, the housing is deformed plastically and contacted with the heat sink at its groove. The groove may have a rectangular, U-type or V-type shape, for example. Also, it is possible to provide more than just one groove for crimping it with the housing in the heat sink. For example, the heat sink edge of the heat sink may comprise at least two grooves for crimping the housing into the at least two grooves.

The heat sink may be configured as an at least partially circular heat plate. In particular, the heat sink may be at least a half or fully circular heat plate. The heat sink edge of the heat sink may have or circumscribe the circular form of the heat plate. The heat sink may be a flat plate in the sense that its thickness is less than its diameter or radius. The heat sink may comprise several heat conduction surfaces arranged in contact with electronic components of the power boards.

Thermal interface material may be provided in between the electronic components and the heat conduction surfaces. Thereby, heat generated by the electronic components may be conducted to the heat sink very effectively. The several heat conduction surfaces may be arranged at different heights along a thickness of the heat sink to accommodate electronic components of different height. Thereby, the design freedom of the at least one power board with regard to its specific electronic components, such as their size and geometry, may be maintained while still enabling a high thermal conductivity of the power boards to the heat sink. In other words, the heat sink may be adapted in its form and geometry to the at least one power board and not the other way around.

It is also possible, that the heat sink comprises heat sink through holes and the first power board is secured to the heat sink by means of bolts passing through the heat sink through holes and being fastened in domes extending from the connector plate. This enables a simple yet reliable and detachable connection of the power boards with the heat sink and further with the connector plate.

Alternatively, or additionally, it is possible, that the heat sink comprises heat sink holes and the second power board is secured to the heat sink by means of bolts being fastened in the heat sink holes. Thereby, a simple yet reliable and detachable connection between the second power board with the heat sink is provided.

In particular, the first power board may be attached by means of the heat sink through holes and domes in the connector plate and the second power board may be attached by means of the holes in the heat sink. This provides for particularly good serviceability, because the second power board may be exchanged without demounting the first power board from the heat sink and further improves the reliability of the secure connection.

It is further possible, that the heat sink comprises heat sink recesses for the at least one second power connector, the at least one second power connector extending from the connector plate through the heat sink recesses inside of the heat sink to the second power board. The at least one second power connector may be used for transferring current from the connector plate, which may be connected to the power source, to the second power board. The heat sink recesses allow for simple yet cost-effective design of the heat sink and the at least one second power connector. The heat sink recesses may be designed as flat slots.

It is also possible, that the heat sink comprises a heat sink cutout, in particular extending from a heat sink edge to an inside of the heat sink, a second logic connector extending from a logic board of the electronic control unit through the heat sink cutout to the second power board. The heat sink cutout may have a partially circular and/or partially flat shape. The heat sink cutout allows for simple yet cost-effective design of the heat sink and the second logic connector.

Thereby, it is possible, that the first electric motor connector from the second power board extends through the heat sink cutout for connection with the electric motor of the electric power steering system. Thereby, the number of cutouts or recesses may be reduced and the electronic control unit may have a compact design. By means of the first electric motor connector, driving current from the first power board may be transmitted along the electronic control unit, passing by the heat sink, to the electric motor.

Further it is possible, that the heat sink comprises heat sink projections projecting from the heat sink beyond the first power board and the second power board and being arranged to rest on an inner rim inside of the housing of the electric power steering system. By means of the heat sink projections, when installing the electronic control unit in the housing, the end position of the electronic control unit in the housing may be easily detected. The end position is achieved when the projections rest on the inner rim inside the housing and the electronic control unit cannot be pushed into the housing any further without using excessive force to bend or damage the projections. Thereby, a defined position at which the housing is crimped into the groove is provided and the crimping can be performed at that defined position every time when joining the heat sink with the housing facilitating the manufacture.

According to a second aspect of the invention, the problem raised in the introduction of this description is solved by an electric power steering system comprising the electronic control unit according to the first aspect of the invention, whereby the electric motor of the electric power steering system is electrically connected to the first power board by means of the first electric motor connector and to the second power board by means of the second electric motor connector.

When the heat sink comprises projections projecting from the heat sink beyond the at least one power board, the projections may rest on an inner rim inside of the housing of the electric power steering system. Thereby, a defined position of the electronic control unit in the housing and a stable connection therewith is achieved.

The electric power steering system may further comprise a torque sensor, a steering shaft, a handle, in particular a steering wheel, and a power source. The electric power steering system may further have the arrangement and be arranged for operation of in an automobile as described in the introductory part of this description.

Further advantages, features and details of the invention unfold from the following description, in which by reference to drawings of the following Figures an embodiment of the present invention is described in detail. Thereby, the features from the claims as well as the features mentioned in the description can be essential for the invention as taken alone or in an arbitrary combination.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE INVENTION

Figure 1:
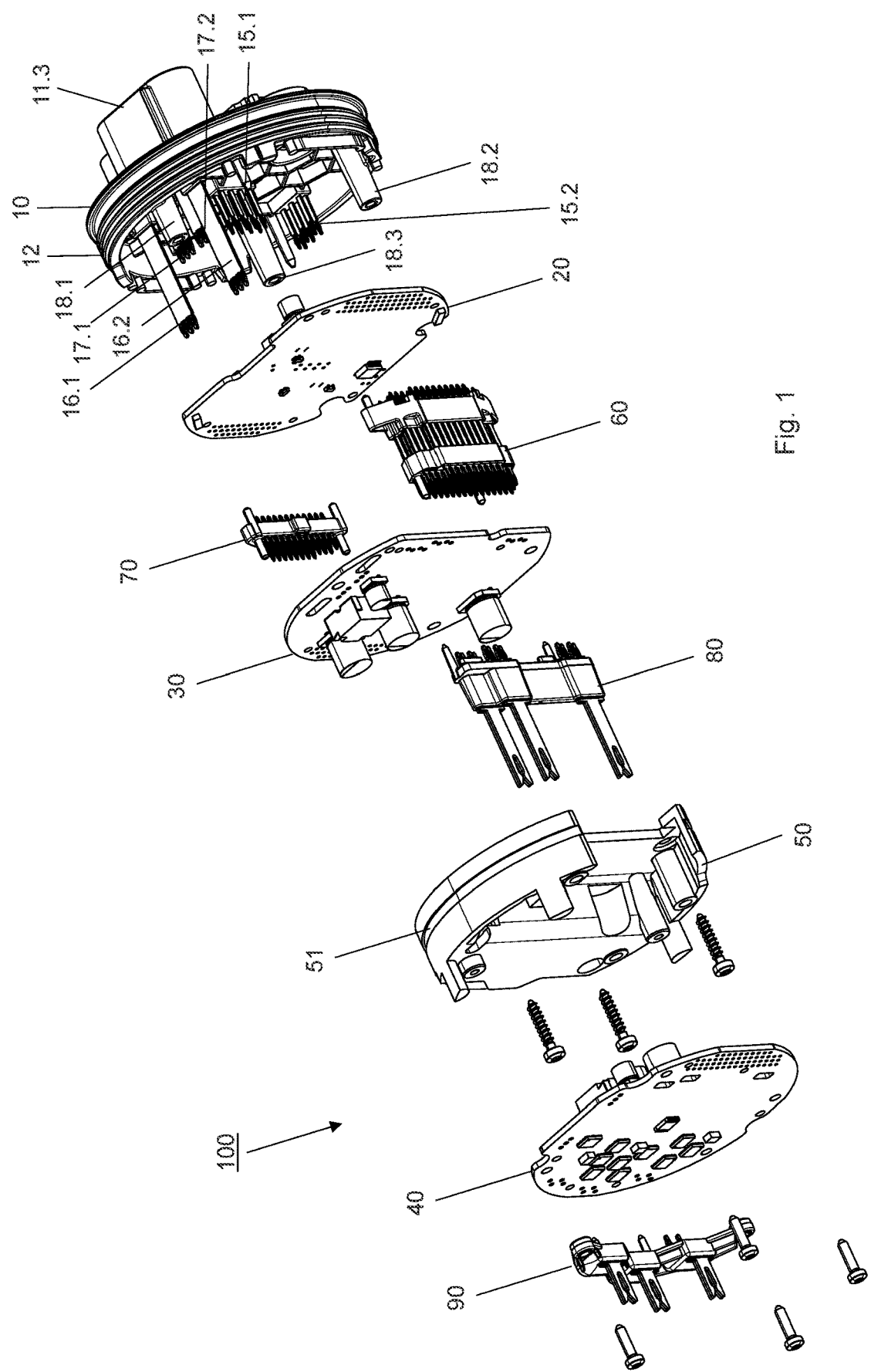
FIG. 1 is an exploded illustration from a bottom side perspective view of an embodiment of the electronic control unit according to the first aspect of the invention.

FIG. 1 shows an exploded illustration of an electronic control unit 100 according to an embodiment of the invention from a bottom side perspective view. According to this bottom side perspective view, bottom sides of the parts of the electronic control unit 100 are visibly illustrated.

Figure 2:
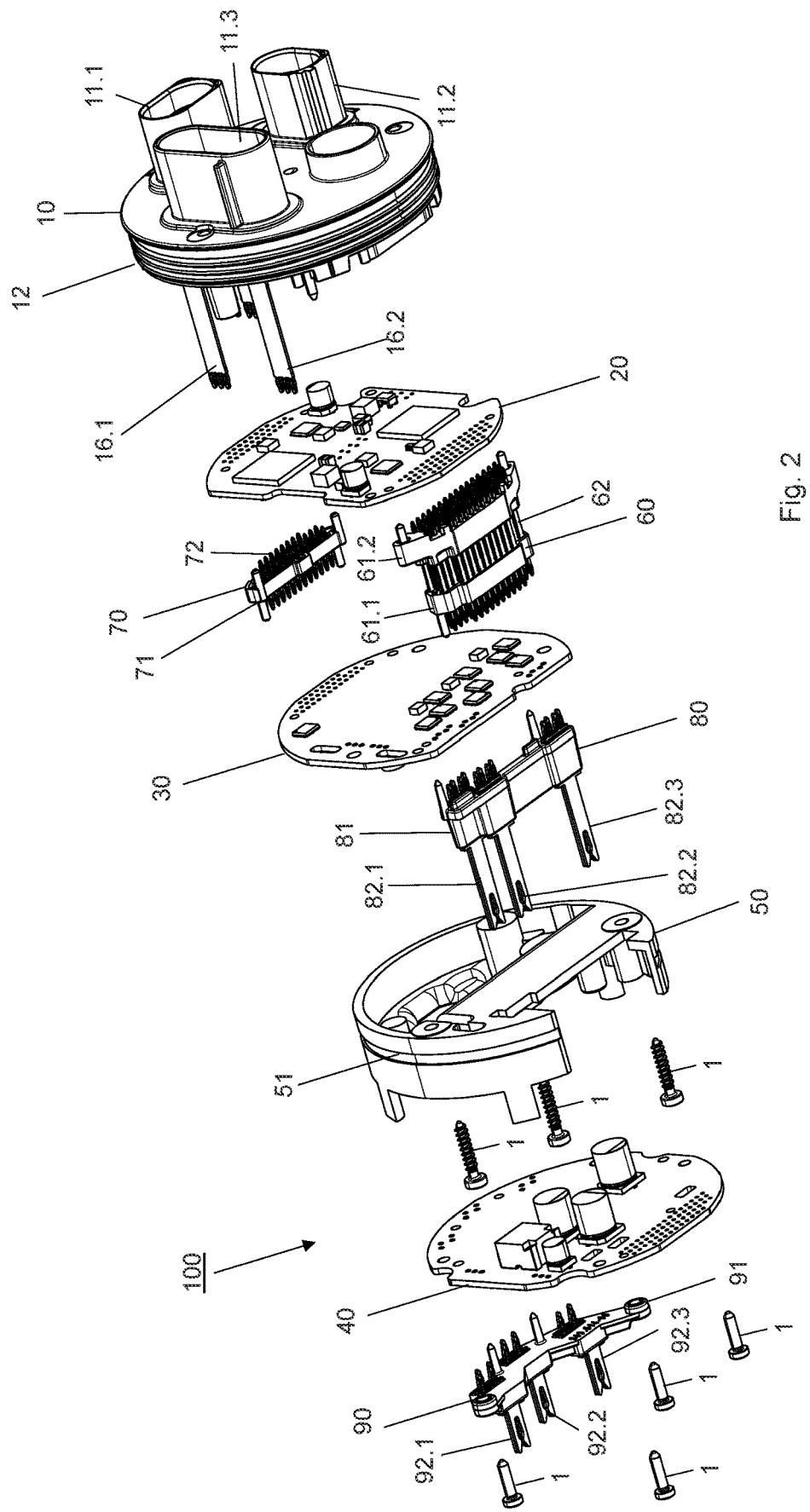
FIG. 2 is an exploded illustration from a top side perspective view of the electronic control unit of FIG. 1.

FIG. 2 shows the same electronic control unit 100 of FIG. 1 with the difference that it is from a top side perspective view. According to this top side perspective view, top sides of the parts of the electronic control unit 100 are visibly illustrated.

As can be taken from FIGS. 1 and 2, the electronic control unit 100 comprises two power boards 30, 40, namely a first power board 30 and a second power board 40. The power boards 30, 40 may also be referred to as power-stages. The two power boards 30, 40 are arranged so as to supply an electric motor (not shown) of an electric power steering system 200 (see FIGS. 10 and 11) with driving current. For this purpose, the first power board 30 is connected to a first electric motor connector 80 electrically connectable with the electric motor. Further, for this purpose, the second power board 40 is connected to a second electric motor connector 90 electrically connectable with the electric motor.

Further, the electronic control unit 100 comprises a connector plate 10. The connector plate 10 comprises multiple, in this particular embodiment three, plug connectors 11.1, 11.2, 11.3. In this particular embodiment, the first plug connector 11.1 and the second plug connector 11.2 are provided with electric contacts (not shown) inside thereof. The electric contacts may be made from a copper alloy, for example, to allow for good electric conductivity. These electric contacts are arranged as first and second signal connectors 15.1, 15.2. The signal connectors 15.1, 15.2 extend from the plug connectors 11.1, 11.2 on a top side of the connector plate 10 to a bottom side of the connector plate 10.

The electronic control unit 100 also comprises a logic board 20. The logic board 20 is arranged so as to control the two power boards 30, 40 or, in other words, the operation of the electronic control unit 100 or, in further other words, the transmission of driving current to the electric motor. For this purpose, the signal connectors 15.1, 15.2 are connected with the logic board 20. Further, the logic board 20 is connected via a first logic connector 70 to the first power board 30. Also, the logic board 20 is connected via a second logic connector 60 to the second power board 40.

Signal plugs (not shown) may be attached to the plug connectors 11.1, 11.2 for supplying signals from a sensor, such as a torque sensor, or other units, such as a further electronic control unit from a transportation equipment (not shown), such as an automobile, to the logic board 20. By means of the signals, such as a torque detected by the torque sensor or a travelling speed of the transportation equipment, the logic board 20 may control the driving current via the two power boards 30, 40.

The connector plate 10 further comprises a third plug connector 11.3. This third plug connector 11.3 comprises inside further electric contacts. These electric contacts are provided as first power connectors 16.1, 16.2 and second power connectors 17.1, 17.2. The second power connectors 17.1, 17.2 are longer than the first power connectors 16.1, 16.2 such that they may accordingly connect with their respective power boards 30, 40 at their respective distance from the connector plate 10. In this embodiment, the first power connectors 16.1, 16.2 and the second power connectors 17.1, 17.2 are provided as metal strips.

A power plug (not shown) may be connected to the third plug connector 11.3 to provide power to the first power connectors 16.1, 16.2 and second power connectors 17.1, 17.2. The power plug may be attached to a power source such as a battery (not shown) of the transportation equipment. The power source is arranged as a three-phase electric power source. The connector plate 10 may also be referred to as a power and logic connector plate as it provides power and logic or signal processing connections to the respective boards 20, 30, 40 of the electronic control unit 100.

The first power connectors 16.1, 16.2 are connected to the second power board 40 and the second power connectors 17.1, 17.2 are connected to the first power board 30. Thereby, the first power board 30 is provided with a three-phase electric current and the second power board 40 is provided with a three-phase electric current. The electronic control unit 100 is thereby provided with six phases and the electric motor may be provided as a six-phases electric motor. When one of the two power boards 30, 40 fails due to an error, the other one can ensure safe and reliable operation of the electric motor by transmitting driving current to it. Thereby, it is prevented that an error in one of the power boards 30, 40 leads to undesirable loss of the steering function and possibly in an accident and damage of the driver and passengers of the transportation equipment.

As can further be taken from FIGS. 1 and 2, a heat sink 50 is arranged in between the first power board 30 and the second power board 40. The heat sink 50 is thus sandwiched in between the two power boards 30, 40. The heat sink 50 in this embodiment is provided as a die-cast aluminum. The heat sink 50 allows for the heat generated in the two power boards 30, 40 to be dissipated away. For this purpose, the heat sink 50 is connected to a housing 210 of the electric power steering system 200, which will be explained later in more detail.

Also, the connector plate 10 comprises a venting opening 13 and a venting element (not shown) for closing the venting opening 13. When the electronic control unit 100 is inserted into the housing 210, which also will be explained in more detail letter, the venting element provides for pressure compensation of the inside of the housing 210 with the environment. Further, the connector plate 10 comprises a sealing 12. The sealing 12 is made from a silicone rubber in this particular embodiment. The sealing 12 seals the electronic control unit 100 inside the housing 210 against the environment when it is inserted into the housing 210.

Figure 3:
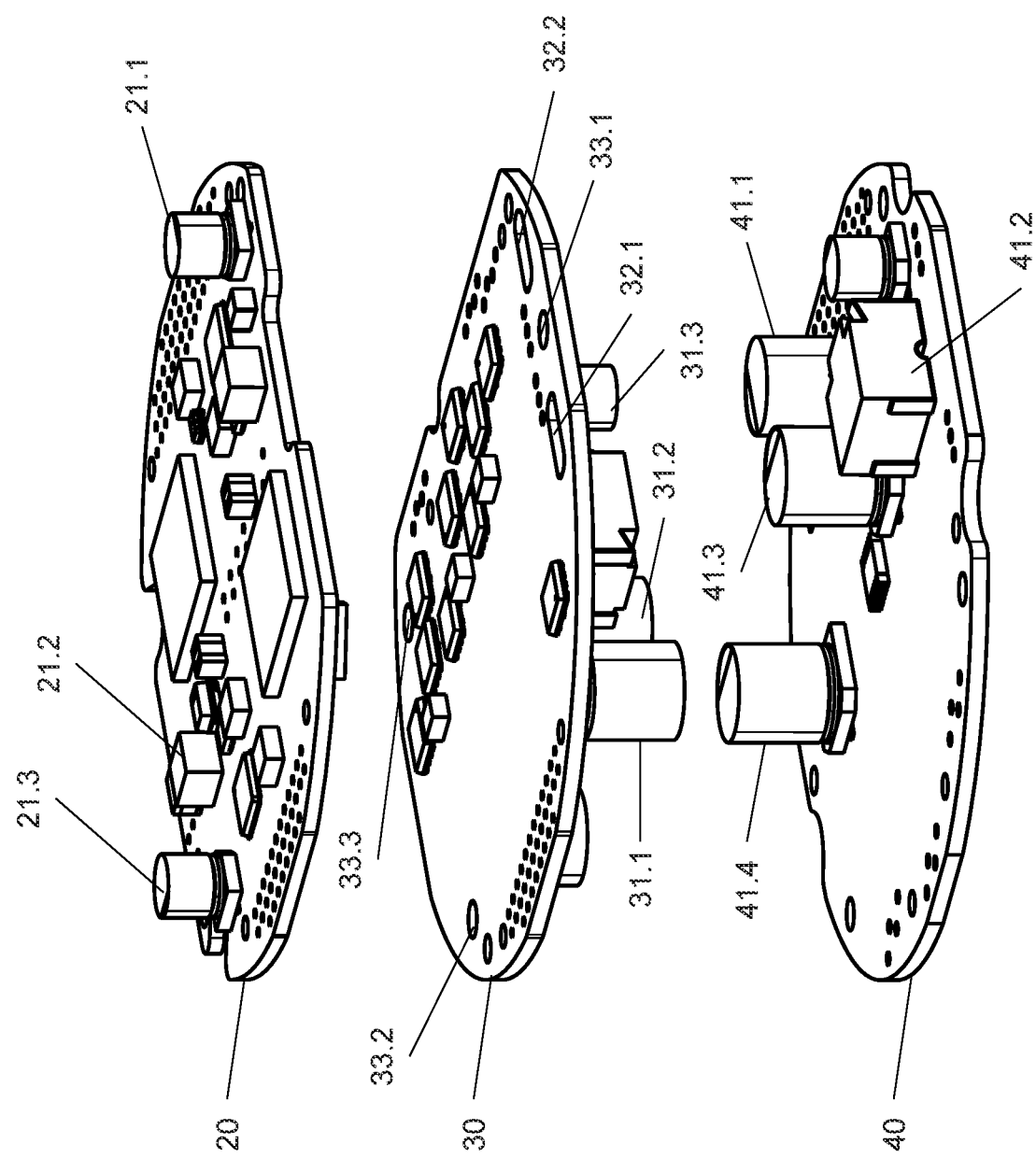
FIG. 3 is a detailed illustration from a side perspective view of two power boards and a logic board of the electronic control unit of FIGS. 1 and 2.

FIG. 3 shows the logic board 20, first power board 30 and second power board 40 in more detail in an exploded view. The logic board 20 comprises first electronic components 21, of which the first electronic components 21.1, 21.2, 21.3 are exemplary denominated. Further, the first power board 30 comprises second electronic components 31, of which the second electronic components 31.1, 31.2, 31.3 are exemplary denominated. Moreover, the second power board 40 comprises third electronic components 41, of which the third electronic components 31.1, 31.2, 31.3 are exemplary denominated.

The first electronic components 21 may be coils, capacitors, at least one computing unit, such as a processor, and other electronic components for enabling calculation operations based on received signals and logic communication of the logic board 20 with the two power boards 30, 40. The second and third electronic components 31, 41 may be coils, capacitors and other electronic components for enabling the respective power board 30, 40 to transmit power from a power source to the electric motor as will be explained further later.

The logic board 20, the first power board 30 and the second power board 40 are shown in an orientation with their respective top sides and bottom sides such as they are arranged within the electronic control unit 100. Thus, the largest of the second electronic components 31.1, 31.2, 31.3 on a bottom side of the first power board 30 show towards the largest of the third electronic components 41.1, 41.2, 41.3 of the second power board 40. These large electronic components 31, 41 generate a lot of heat and by virtue of this arrangement a heat sink 50 may receive the second and third electronic components 31, 41 to allow for good heat conductivity characteristics so as to remove the heat from the two power boards 30, 40 via the heat sink 50 and housing 210 effectively.

Further, the first power board 30 comprises first power board recesses 32.1, 32.2 for guiding the second power connectors 16.1, 16.2 therethrough. Also, the first power board 30 comprises power board through holes 33.1, 33.2, 33.3 for guiding bolts 1 therethrough for fastening the heat sink 50 to the connector plate 10. These features will be explained later in more detail.

Figure 4:
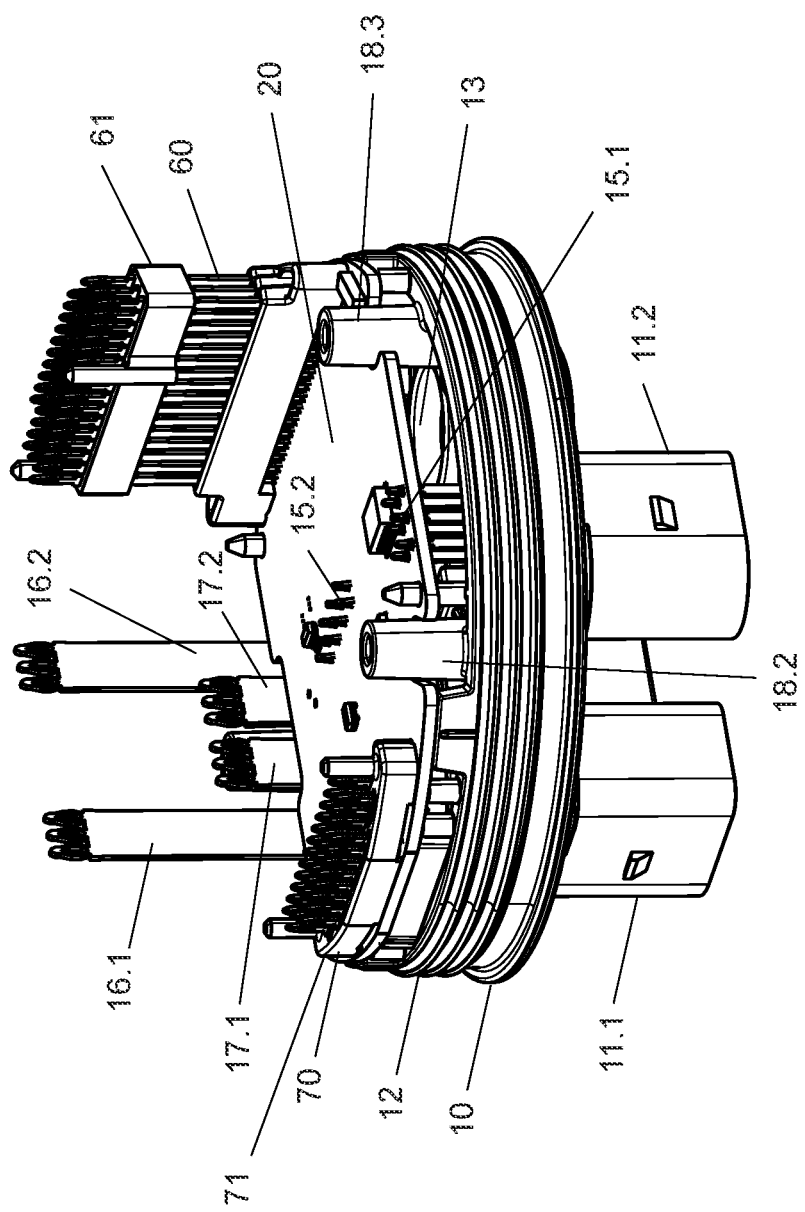
FIG. 4 is a detailed illustration from a side perspective view on the assembled logic board with the connector plate.

FIG. 4 shows an assembly of the logic board 20 with the connector plate 10. The first and second signal connectors 15.1, 15.2 are connected to the logic board 20. In particular, the first and second signal connectors 15.1, 15.2 comprise multiple pins being attached to corresponding pin receiving holes in the logic board 20.

The logic board 20 comprises two logic connectors 60, 70 connected thereto and having the purpose of enabling communication and control of the two power boards 30, 40 by means of the logic board 20. Therefore, each of the two logic connectors 60, 70, namely the first logic connector 70 and the second logic connector 60, comprises multiple electrical connector pins (not denominated). The electrical connector pins of the first logic connector 70 are relatively shorter than the electrical connector pins of the second logic connector 60. The reason for this is that the first logic connector 70 connects the logic board 20 with the first power board 30, whereby the distance between the logic board 20 and the first power board 30 in an assembled state of the electronic control unit 100 is relatively short. However, the distance between the logic board 20 and the second power board 40, which are connected by means of the second logic connector 60, is relatively longer because the first power board 30 and the heat sink 50 are arranged in between as can be seen in the assembled state of the electronic control unit 100 from FIG. 10, for example.

The electrical connector pins are inserted into corresponding connector pin holes (not denominated) inside the logic board 20. The connector pin holes for the respective electrical connector pins are arranged at two opposite ends of the logic board 20. Thereby, the first logic connector 70 and the second logic connector 60 are arranged at the two opposite ends of the logic board 20. Further, the logic board 20 comprises connection pin holes (not denominated) for corresponding first connection pins (not denominated) of the first logic connector 70 and connection pin holes for corresponding second connection pins (not denominated) of the second logic connector 60. By means of the connection pins the two logic connectors 60, 70 are securely fastened in the logic board 20.

The electrical connector pins are arranged in logic connector housings 71, 61 of the logic first logic connector 70 and the second logic connector 60. In this particular embodiment, the second logic connector housing 61 consists of two separate parts. This design may be chosen due to the long extension of the its electrical connector pins. The first part of the second logic connector housing 61 comprises the connection pins for corresponding connection pin holes of the logic board 20 and the second part of the second logic connector housing 61 comprises connection pins for securing them in corresponding connection pin holes of the second power board 40. Moreover, the first logic connector housing 71 comprises connection pins for securing them in corresponding connection pin holes of the first power board 30.

As may be taken from this Figure, the logic board 20 comprises cutouts at its edge for domes 18.1, 18.2, 18.3 projecting from the connector plate 10 towards and beyond the logic board 20. These domes 18.2, 18.3 enable fastening of the heat sink 50 with the connector plate 10 and thereby sandwiching the logic board 20 and the first power board 30 in between these as will be explained later. The domes 18.2, 18.3 may be provided with molded holes inside. The molded holes may be pre-threaded for bolts 1 or threaded by means of self-tapping bolts or screws 1.

The first power connectors 17.1, 17.2 are extending from the connector plate 10 through a cutout (not denominated) at the edge of the logic board 20 towards the first power board 30. Further, the second power connectors 16.1, 16.2 extend from the connector plate 10 next to logic board 20 and the first power connectors 17.1, 17.2 towards the second power board 40.

Figure 5:
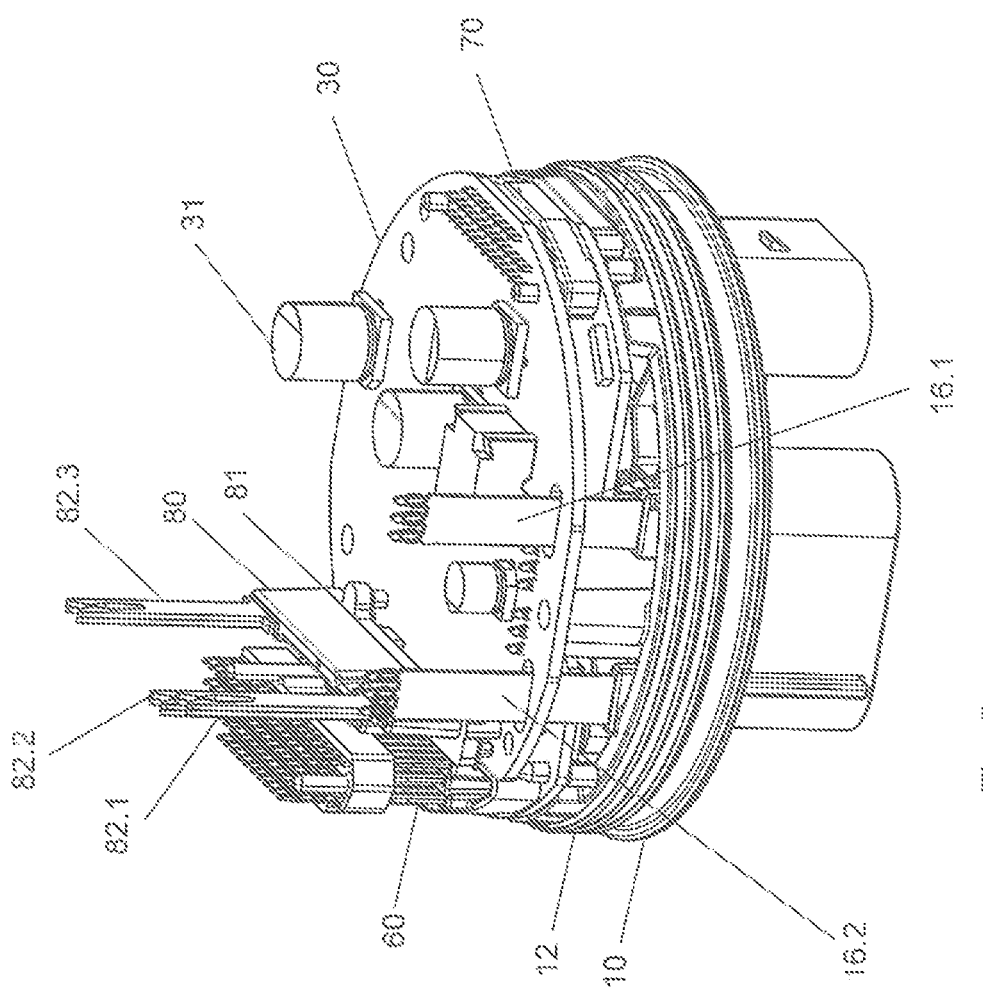
FIG. 5 is a detailed illustration from a side perspective view on the assembled logic board with the connector plate and the assembled first power board.

FIG. 5 shows an assembly of the first power board 30 with the logic board 20 and the connector plate 10.

A first electric motor connector 80 comprises three first electric phase pins 82.1, 82.2, 82.3 for electric connection with the electric motor of the electric power steering system 200. The three first electric phase pins 82.1, 82.2, 82.3 are received in a first electric motor connector housing 81. The first electric motor connector housing 81 comprises connection pins (not denominated) for connection with corresponding connection pin holes (not denominated) in the first power board 30. Further, the three first electric phase pins 82.1, 82.2, 82.3 comprise at ends opposite of the ends for connecting with corresponding electric motor pins (not shown) of the electric motor several first power board connection pins (not shown) for electrically connecting these with the first power board 30.

The first logic connector 70 is connected with the first power board 30. Further, the second power connectors 16.1, 16.2 are guided through the first power board recesses 32.1, 32.2 of the first power board 30.

Figure 6:
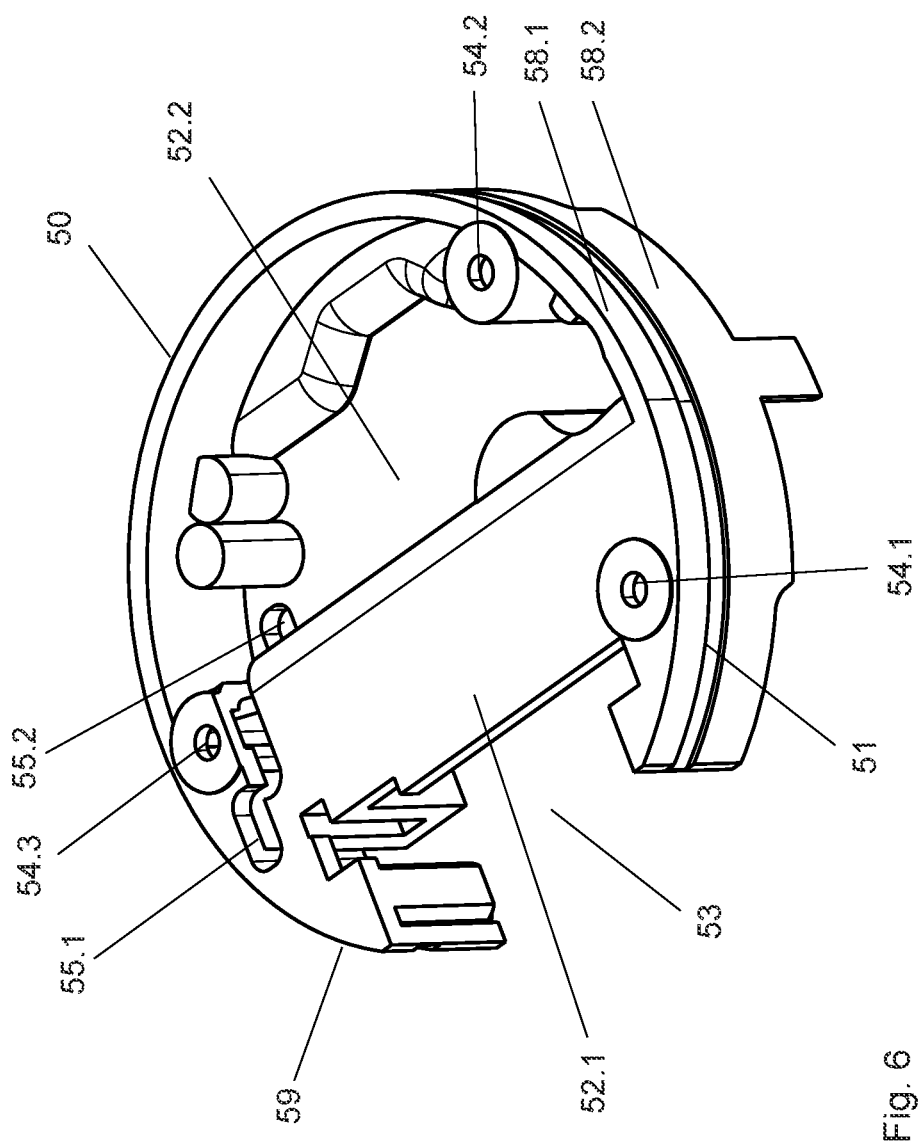
FIG. 6 is a detailed illustration from a side perspective view on a heat sink of the electronic control unit of FIGS. 1 and 2.

The first electric motor connector 80 is arranged next to the second logic connector 60 such that they may extend together along a heat sink cutout 53 as shown in the heat sink 50 of FIG. 6. The first electronic components 31 of the first power board 30 extend towards the heat sink 50 to be arranged on the top side of the first power board 30.

FIG. 6 shows the heat sink 50 in more detail and from its bottom side. A heat sink edge 59 of the heat sink 50 circumscribes the heat sink 50. The heat sink 50, in particular the heat sink edge 59, comprises the groove 51 for crimping the housing 210 of the electric power steering system 200 into the groove 51. Thereby, the housing 210 is mechanically secured to the heat sink 50 and ultimately to the electronic control unit 100. Further, the heat sink 50 is thermally connected to the housing 210 such that the heat generated by the two power boards 30, 40 may be dissipated via the heat sink 50 along the housing 210 having a much larger surface area for dissipation. Also, the surface area of the housing 210 may be in thermal connection with the environment such that the housing 210 is cooled or, in other words, may exchange heat with the environment.

The groove 51 is a circumferential groove 51 such that it is arranged around the circumference of the heat sink edge 59. The heat sink edge 59 further comprises two circumferential outer surfaces 58.1, 58.2, in between which the circumferential groove 51 is provided. The two circumferential outer surfaces 58.1, 58.2 of the heat sink edge 59 are configured to contact an inner surface 211 of the housing 210 as may be taken from FIG. 17. For this purpose, the outer diameter of the circumferential outer surfaces 58.1, 58.2 equals or substantially equals the inner diameter of the inner surface 211 of the housing 210.

Figure 7:
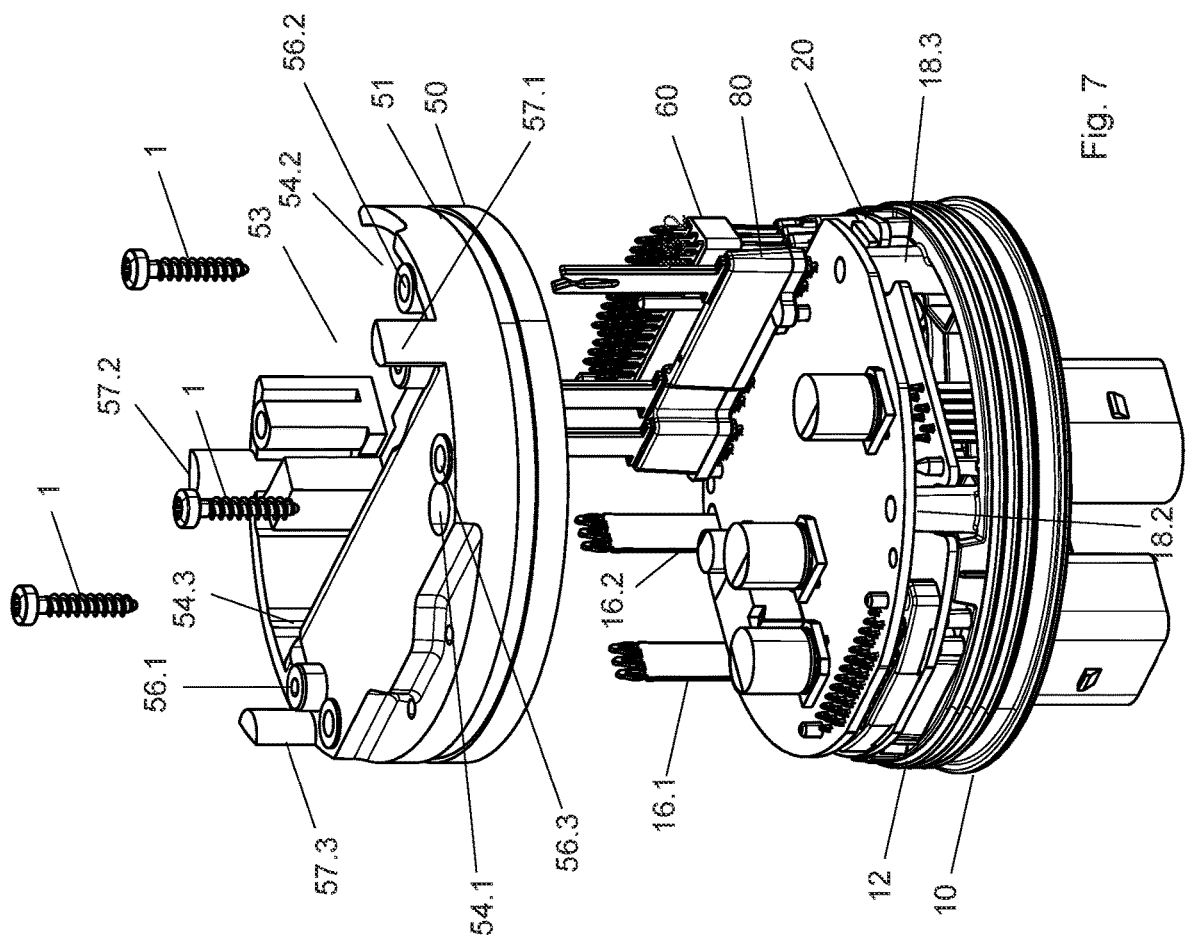
FIG. 7 is a detailed illustration from a side perspective view on the assembly of the heat sink of FIG. 6 with the assembly of the assembled logic board with the connector plate and the first power board of FIG. 5.
Figure 8:
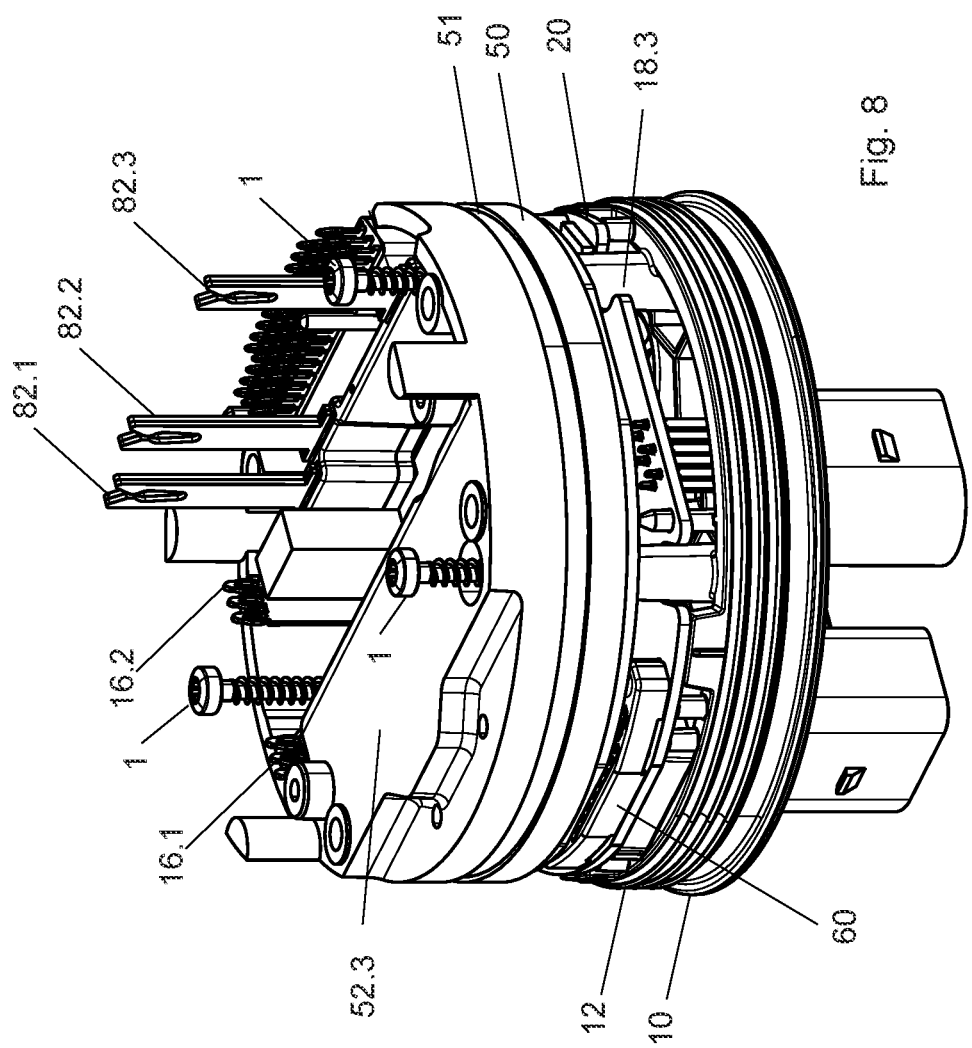
FIG. 8 is a detailed illustration from a side perspective view on the assembly of the assembled logic board with the connector plate, the assembled first power board and the heat sink of FIG. 6.

The structure of the heat sink 50 will in the following be further explained with reference to FIGS. 7 and 8, FIG. 7 showing a process of assembling the heat sink 50 with the first power board 30 assembled with the logic board 20 and the connector plate 10 and FIG. 8 showing the assembly according to the process of FIG. 7. FIG. 7 and FIG. 8 show a top side of the heat sink 50 whereas FIG. 6 shows a bottom side of the heat sink 50.

Figure 9:
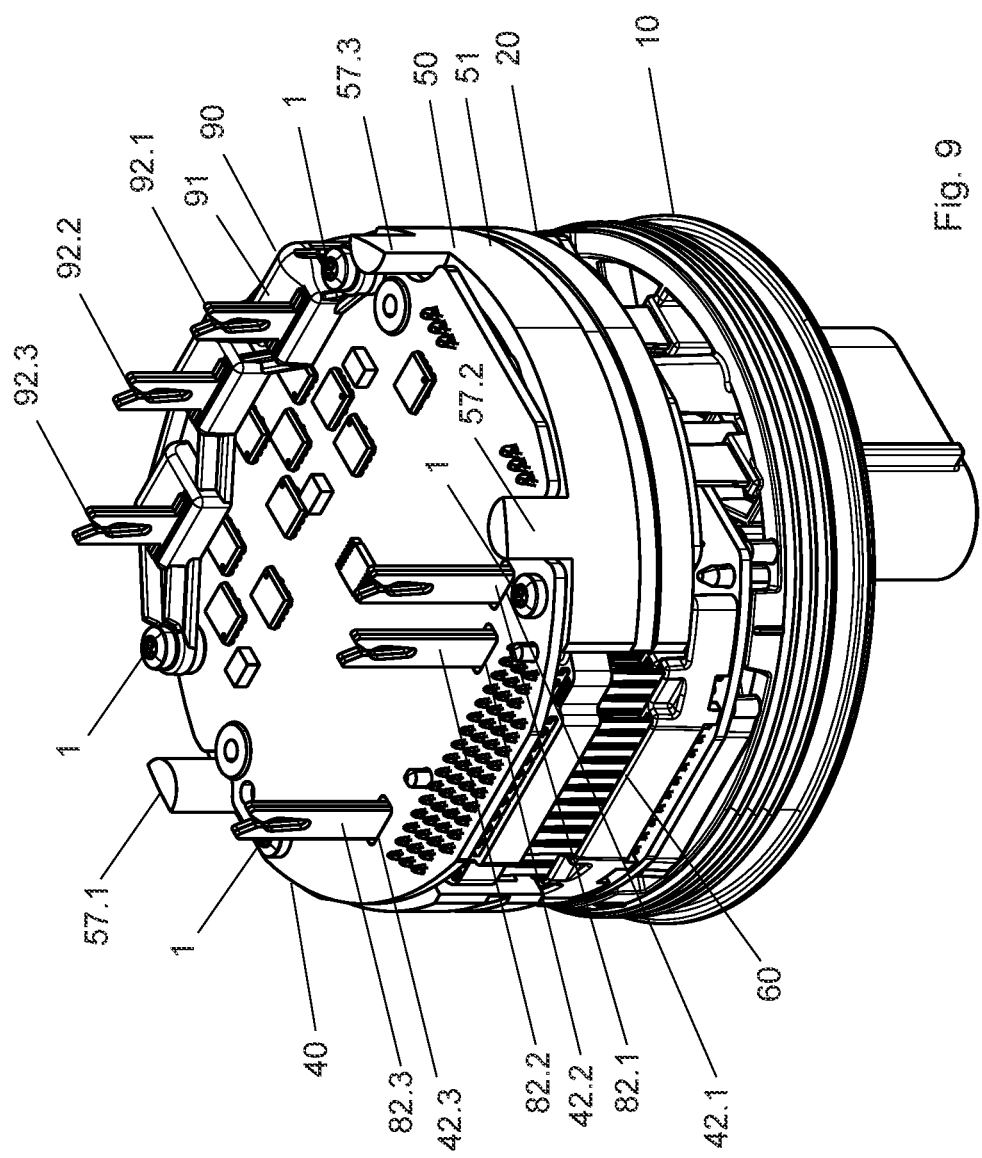
FIG. 9 is an illustration from a side perspective view on the electronic control unit 100 of FIGS. 1 and 2 in an assembled state.

The heat sink 50 is configured as a circular heat plate, whereby the heat sink 50 comprises a heat sink cutout 53. The heat sink cutout 53 extends from the heat sink edge 59 to an inside of the heat sink 50. The second logic connector 60 and the first electric motor connector 80 extend through the heat sink cutout 53 in the assembled state where the heat sink 50 is attached to the first power board 30 as can be seen in FIG. 9.

Further, the heat sink 50 comprises several heat conduction surfaces 52 on its bottom side and on its top side for attaching them to the first power board 30 and the second power board 40, in particular the first electronic components 31 and the second electronic components 41, by means of a thermal interface material (not shown). The heat conduction surfaces 52.1, 52.2 on the bottom side and the heat conduction surface 52.3 on the top side are exemplary denominated in the FIGS. 6 and 8. In the assembled state of FIG. 8, the first electronic components 31 of the first power board 30 are in direct contact via the thermal interface material with the heat conduction surfaces 52.1, 52.2 on the bottom side of the heat sink 50. The heat conduction surfaces 52.1, 52.2 of the bottom side are arranged at different heights along a thickness of the heat sink 50 and thereby can accommodate or attach to first electronic components 31 of different size or height. The same can be applied to the top side such that heat conduction surfaces 52 of the top side of the heat sink 50 may be arranged at different heights along the thickness of the heat sink 50. Thereby, the first electronic components 31 are effectively transferring heat to the heat sink 50.

Figure 10:
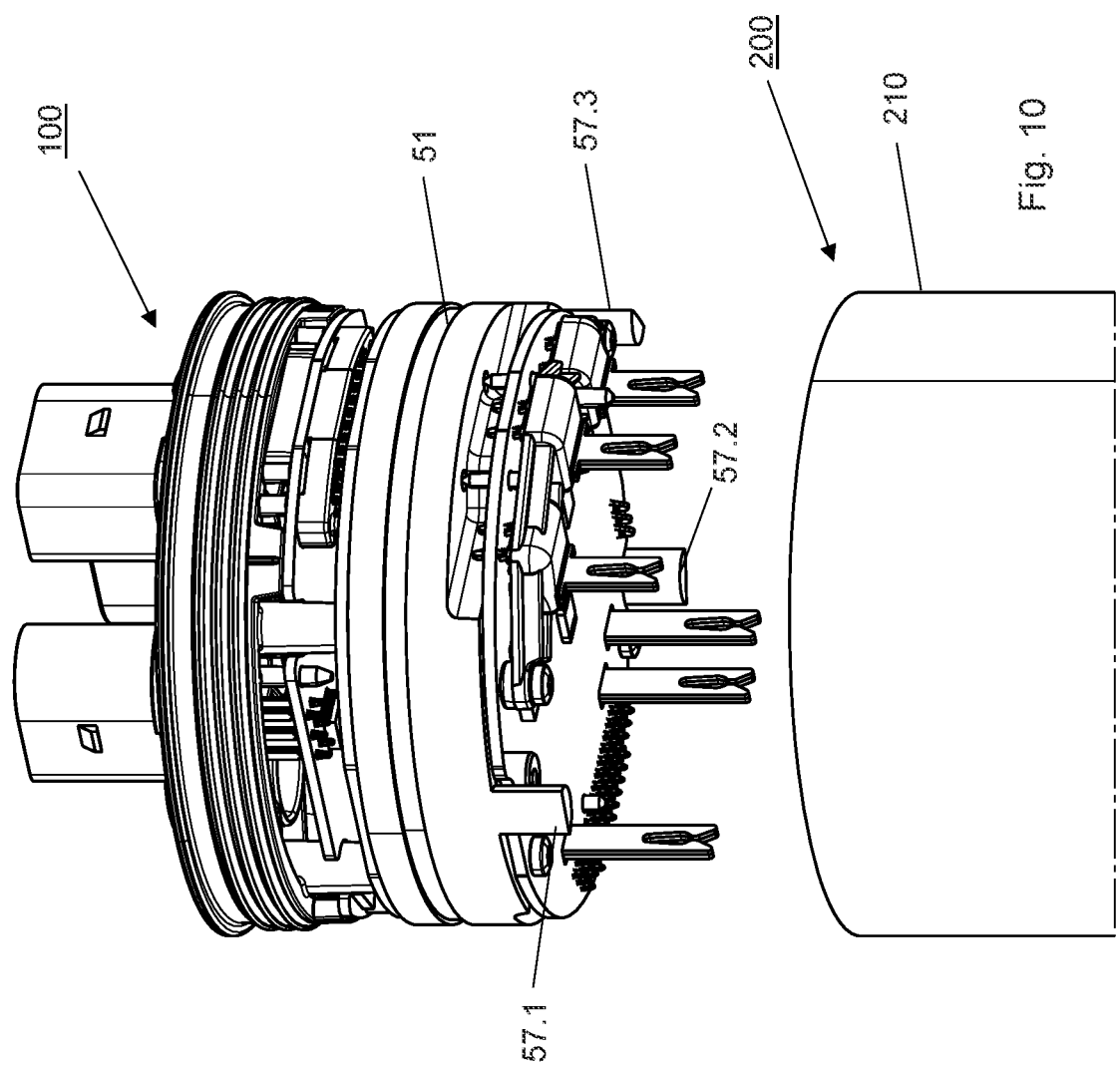
FIG. 10 is an illustration from a side perspective view on a process of assembling the electronic control unit of FIG. 9 with an embodiment of the electric power steering system of the invention.
Figure 11:
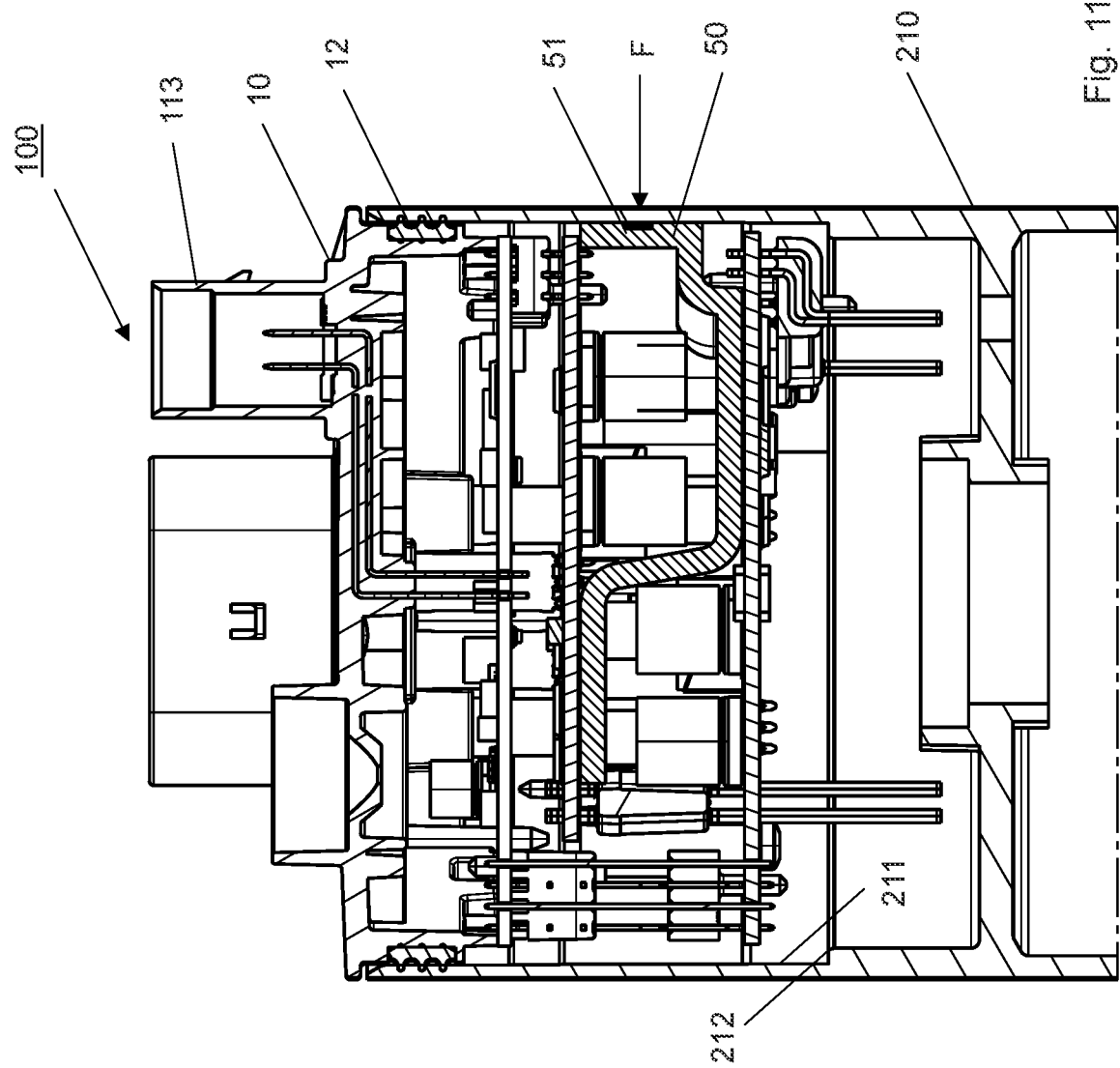
FIG. 11 is an illustration of a sectional cut through the electric power steering system of FIG. 10 with the electronic control unit assembled inside.

Moreover, the heat sink 50 comprises heat sink through holes 54.1, 54.2, 54.3 as can be seen in FIG. 10 from the bottom side and in FIG. 11 from the top side. The first power board 30 is secured by means of bolts 1 passing through the heat sink through holes 54 and being fastened in the domes 18.1, 18.2 of the connector plate 10. The bolts 1 further pass through the power board through holes 33.1, 33.2, 33.3 of the first power board 30 as shown in Figure.

Also, the heat sink 50 comprises heat sink recesses 15 for guiding the second power connectors 16.1, 16.2 of the connector plate 10 therethrough. This enables for the second power connectors 16.1, 16.2 to be connected to the second power board 40 when the heat sink 50 is attached to the first power board 30.

Moreover, the heat sink 50 comprises heat sink projections 57.1, 57.2, 57.3 projecting from the heat sink 50 beyond the two power boards 30, 40 in the assembled state of the electronic control unit 100 as can be seen in FIG. 10. These heat sink projections 57.1, 57.2, 57.2 may be arranged resting on an inner rim 212 inside of the housing 210 of the electric power steering system 200.

The heat sink 50 also comprises heat sink holes 56.1, 56.2, 56.3 on its top side. The second power board 40 may be fastened to the heat sink 50 by means of bolts 1 in the heat sink holes 56.1, 56.2, 56.3. The heat sink holes 56.1, 56.2, 56.3 may be pre-threaded or threaded by means of self-tapping bolts or screws 1.

FIG. 9 shows the electronic control unit 100 in the assembled state. The second power board 40 with the second electronic components 41 on the bottom side are attached the to the heat conduction surfaces 52 of the top side of the heat sink 50. The second electric motor connector 90 comprises three second electric phase pins 92.1, 92.2, 92.3 arranged in a second electric motor connector housing 91. The second electric motor connector housing 91 comprises further connection pins for connection with sixth connection pin holes in the second power board 40.

Further, the three second electric phase pins 92.1, 92.2, 92.3 comprise at ends opposite of the ends for connecting with corresponding electric motor pins (not shown) of the electric motor several second power board connection pins for electrically connecting these with the second power board 40. Further, the second electric motor connector housing 91 comprises second electric motor connector housing through holes for guiding bolts 1 therethrough for connection of the second power board 40 to the heat sink holes 56.1, 56.3 of the heat sink 50 by means of the second electric motor connector housing 91.

Further bolts 1 are guided through corresponding through holes in the second power board 40 for connection to the heat sink holes 56.2, 56.4 of the heat sink 50. Here, the second power board 40 is attached to the top side of the heat sink 50 with its bottom side. The second power board 40 also comprises second power board recesses 42.1, 42.2, 42.3 through with the first electric phase pins 82.1, 82.2, 82.3 of the first electric motor connector 80 are guided.

All bolts 1 are fastened such that the second power board 40 is fastened to the heat sink 50 and the heat sink 50 is fastened to the connector plate 10. The heat sink 50 is thereby sandwiched in between the first power board 30 and the second power board 40. The logic board 20 is sandwiched in between the first power board 30 and the heat sink 50. The electric phase pins 82.1, 82.2, 82.3, 92.1, 92.2, 92.3 extend out of the second power board 40 and in particular beyond the heat sink projections 57.1, 57.2, 57.3 such that they may be connected with the electric motor pins of the electric motor. The venting element may be inserted into the venting opening 13 after inserting the electronic control unit 100 into the housing 210.

FIG. 10 shows the process of inserting the electronic control unit 100 into the housing 210 of the electric power steering system 200. The heat sink projections 57.1, 57.2, 57.3 act as guides during this process.

FIG. 11 shows a cross section through a part of the electric power steering system 200 having the housing 210. Therein, the housing 210 is not yet crimped into the groove 51 of the heat sink 50. However, the operation of crimping is indicated by an arrow referenced with the direction of force F of the crimping operation. Thereby, the housing 210 is plastically deformed and extends into the groove 51 of the heat sink 50. The heat sink 50 and the housing 210 thereby become attached to one another and thermally coupled.

Further, the circumferential outer surfaces 58.1, 58.2 of the heat sink 50 are attached to the inner surface 211 of the housing 210 for thermal coupling and allowing the heat sink 50 to dissipate heat generated by the two power boards 30, 40 attached to the heat sink 50 through the housing 210 into the environment. Also, the heat sink projections 58.1, 58.2, 58.3 may be arranged to rest on the inner rim 212 inside of the housing 210.

The housing 210 is further sealed by means of the circumferential sealing 12 of the connector plate 10 of the electronic control unit 100 against its inner surface 211. The connector plate 10 is thereby designed as a cap of the housing 210. Further, as can be seen in this cross section, the first electric phase pins 82.1, 82.2, 82.3 are to be electrically connected to electric motor pins of the electric motor of the electric power steering system 200.

LIST OF REFERENCE SIGNS

10 Connector plate
11 Plug connector
12 Sealing
13 Venting opening
15 Signal connectors
16 Second power connector
17 First power connector
18 Dome
20 Logic board
21 First electronic component
30 First power board
31 Second electronic component
32 First power board recess
33 Power board through hole
40 Second power board
41 Third electronic component
42 Second power board recess
50 Heat sink
51 Groove
52 Heat conduction surface
53 Heat sink cutout
54 Heat sink through hole
55 Heat sink recess
56 Heat sink hole
57 Heat sink projection
58 Circumferential outer surface
59 Heat sink edge
60 Second logic connector
61 Second logic connector housing
70 First logic connector
71 First logic connector housing
80 First electric motor connector
81 First electric motor connector housing
82 First electric phase pin
90 Second electric motor connector
91 Second electric motor connector housing
92 Second electric phase pin
100 Electronic control unit
200 Electric power steering system
210 Housing
211 Inner surface
212 Inner rim
F force

The invention claimed is:

1. An electronic control unit for an electric power steering system, the electric power steering system including a housing and an electric motor, the electronic control unit being arranged inside the housing and electrically connected to the electric motor, the electronic control unit comprising:
a first power board having a first electric motor connector for electric connection with the electric motor,
a second power board having a second electric motor connector for electric connection with the electric motor, and
a connector plate having at least one plug connector, the at least one plug connector electrically connecting the connector plate with the first power board via at least one first power connector, and with the second power board via at least one second power connector,
wherein the at least one first power connector is shorter than the at least one second power connector, and
wherein a logic board is sandwiched in between the first power board and the connector plate.

2. The electronic control unit according to claim 1, wherein the connector plate is connected to the first power board via two first power connectors and to the second power board via two second power connectors, wherein both first power connectors are shorter than both second power connectors.

3. The electronic control unit according to claim 1, wherein the at least one first power connector and/or the at least one second power connector are provided as metal strips.

4. The electronic control unit according to claim 1, wherein the at least one second power connector has at least 120% of the length of the first power connector.

5. The electronic control unit according to claim 1, wherein each of the first power board and the second power board is provided with three phases of electricity to supply three-phase electric power to the electric motor.

6. The electronic control unit according to claim 1, wherein the first power board comprises at least one first power board recess through which the at least one second power connector extends to the second power board.

7. The electronic control unit according to claim 1, further comprising a heat sink sandwiched in between the first power board and the second power board.

8. The electronic control unit according to claim 7, wherein the heat sink includes heat sink through holes, and the first power board is secured to the heat sink by bolts passing through the heat sink through holes and being fastened in domes extending from the connector plate.

9. The electronic control unit according to claim 7, wherein the heat sink includes heat sink holes and the second power board is secured to the heat sink by bolts fastened in the heat sink holes.

10. The electronic control unit according to claim 7, wherein the heat sink includes at least one heat sink recess for the at least one second power connector, the at least one second power connector extending from the connector plate through the at least one heat sink recess inside of the heat sink to the second power board.

11. The electronic control unit according to claim 7, wherein the heat sink includes a heat sink cutout, and a second logic connector extends from the logic board through the heat sink cutout to the second power board.

12. The electronic control unit according to claim 11, wherein the first electric motor connector from the first power board extends through the heat sink cutout for connection with the electric motor of the electric power steering system.

13. The electronic control unit according to claim 7, wherein the heat sink includes heat sink projections projecting from the heat sink beyond the first power board and the second power board, and being arranged to rest on an inner rim inside of the housing of the electric power steering system.

14. An electric power steering system comprising:
an electronic control unit according to claim 1;
an electric motor electrically connected to the first power board by the first electric motor connector and to the second power board by the second electric motor connector.

15. An electronic control unit for an electric power steering system, the electric power steering system including a housing and an electric motor, the electronic control unit being arranged inside the housing and electrically connected to the electric motor, the electronic control unit comprising:
a first power board having a first electric motor connector for electric connection with the electric motor,
a second power board having a second electric motor connector for electric connection with the electric motor,
a heat sink sandwiched in between the first power board and the second power board, and
a connector plate having at least one plug connector, the at least one plug connector electrically connecting the connector plate with the first power board via at least one first power connector, and with the second power board via at least one second power connector,
wherein the at least one first power connector is shorter than the at least one second power connector, and
wherein the heat sink includes a heat sink cutout, and a second logic connector extends from a logic board through the heat sink cutout to the second power board.

16. The electronic control unit according to claim 15, wherein the first electric motor connector from the first power board extends through the heat sink cutout for connection with the electric motor of the electric power steering system.

17. An electronic control unit for an electric power steering system, the electric power steering system including a housing and an electric motor, the electronic control unit being arranged inside the housing and electrically connected to the electric motor, the electronic control unit comprising:
a first power board having a first electric motor connector for electric connection with the electric motor,
a second power board having a second electric motor connector for electric connection with the electric motor,
a heat sink sandwiched in between the first power board and the second power board, and
a connector plate having at least one plug connector, the at least one plug connector electrically connecting the connector plate with the first power board via at least one first power connector, and with the second power board via at least one second power connector,
wherein the at least one first power connector is shorter than the at least one second power connector, and
wherein the heat sink includes heat sink projections projecting from the heat sink beyond the first power board and the second power board, and being arranged to rest on an inner rim inside of the housing of the electric power steering system.

* * * * *